(12) United States Patent
Urakawa

(10) Patent No.: US 9,653,316 B2
(45) Date of Patent: May 16, 2017

(54) PLASMA PROCESSING METHOD AND PLASMA PROCESSING APPARATUS

(71) Applicant: TOKYO ELECTRON LIMITED, Tokyo (JP)

(72) Inventor: Masafumi Urakawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/182,707

(22) Filed: Feb. 18, 2014

(65) Prior Publication Data
US 2014/0235062 A1    Aug. 21, 2014

Related U.S. Application Data

(60) Provisional application No. 61/773,925, filed on Mar. 7, 2013.

(30) Foreign Application Priority Data

Feb. 18, 2013   (JP) .................................. 2013-029298
Feb. 17, 2014   (JP) .................................. 2014-027549

(51) Int. Cl.
*H01L 21/302*   (2006.01)
*H01L 21/311*   (2006.01)
(Continued)

(52) U.S. Cl.
CPC .. *H01L 21/31116* (2013.01); *H01J 37/32091* (2013.01); *H01J 37/32165* (2013.01); *H01L 21/32137* (2013.01)

(58) Field of Classification Search
CPC ........... H01L 21/3065; H01L 21/30655; H01L 21/311; H01L 21/31116; H01L 21/31114;
(Continued)

(56) References Cited

U.S. PATENT DOCUMENTS 8,709,953 B2 *   4/2014   Lill et al. ...................... 438/715
2005/0112891 A1 *   5/2005   Johnson ............ H01L 21/30655
                                                                  438/691

(Continued)

FOREIGN PATENT DOCUMENTS

JP    2008-243973 A    10/2008

*Primary Examiner* — Lan Vinh
(74) *Attorney, Agent, or Firm* — Rothwell, Figg, Ernst & Manbeck, P.C.

(57) ABSTRACT

Disclosed is a plasma processing method which includes a gas supplying process, a power supplying process, and an etching process. In the gas supplying process, a processing gas is supplied into a processing container in which an object to be processed is disposed. In the power supplying process, a plasma generating power of a frequency ranging from about 100 MHz to about 150 MHz as a power for generating plasma of the processing gas supplied into the processing container, and a biasing power which is a power having a frequency lower than that of the plasma generating power are supplied. In the etching process, the object to be processed is etched by the plasma of the processing gas while the biasing power is pulse-modulated so that the duty ratio ranges from about 10% to about 70% and the frequency ranges from about 5 kHz to about 20 kHz.

14 Claims, 13 Drawing Sheets

(51) Int. Cl.
*H01L 21/3213* (2006.01)
*H01J 37/32* (2006.01)

(58) Field of Classification Search
CPC ........ A61K 2039/525; A61K 2039/542; A61K 2039/58; H01J 37/3209
USPC ............... 438/706, 710, 712, 714, 717, 725; 216/58, 67, 68
See application file for complete search history.

(56) References Cited

U.S. PATENT DOCUMENTS

| | | |
|---|---|---|
| 2007/0048954 A1* | 3/2007 | Kato et al. .................... 438/308 |
| 2008/0142476 A1* | 6/2008 | Koch ........................ G03F 1/30 216/44 |
| 2008/0149592 A1* | 6/2008 | Belen et al. .................... 216/41 |
| 2010/0048003 A1* | 2/2010 | Sung et al. ................... 438/513 |
| 2010/0066251 A1* | 3/2010 | Nakagami et al. ...... 315/111.51 |
| 2011/0177669 A1* | 7/2011 | Lee et al. ....................... 438/400 |
| 2014/0377959 A1* | 12/2014 | Cho et al. ..................... 438/719 |

* cited by examiner

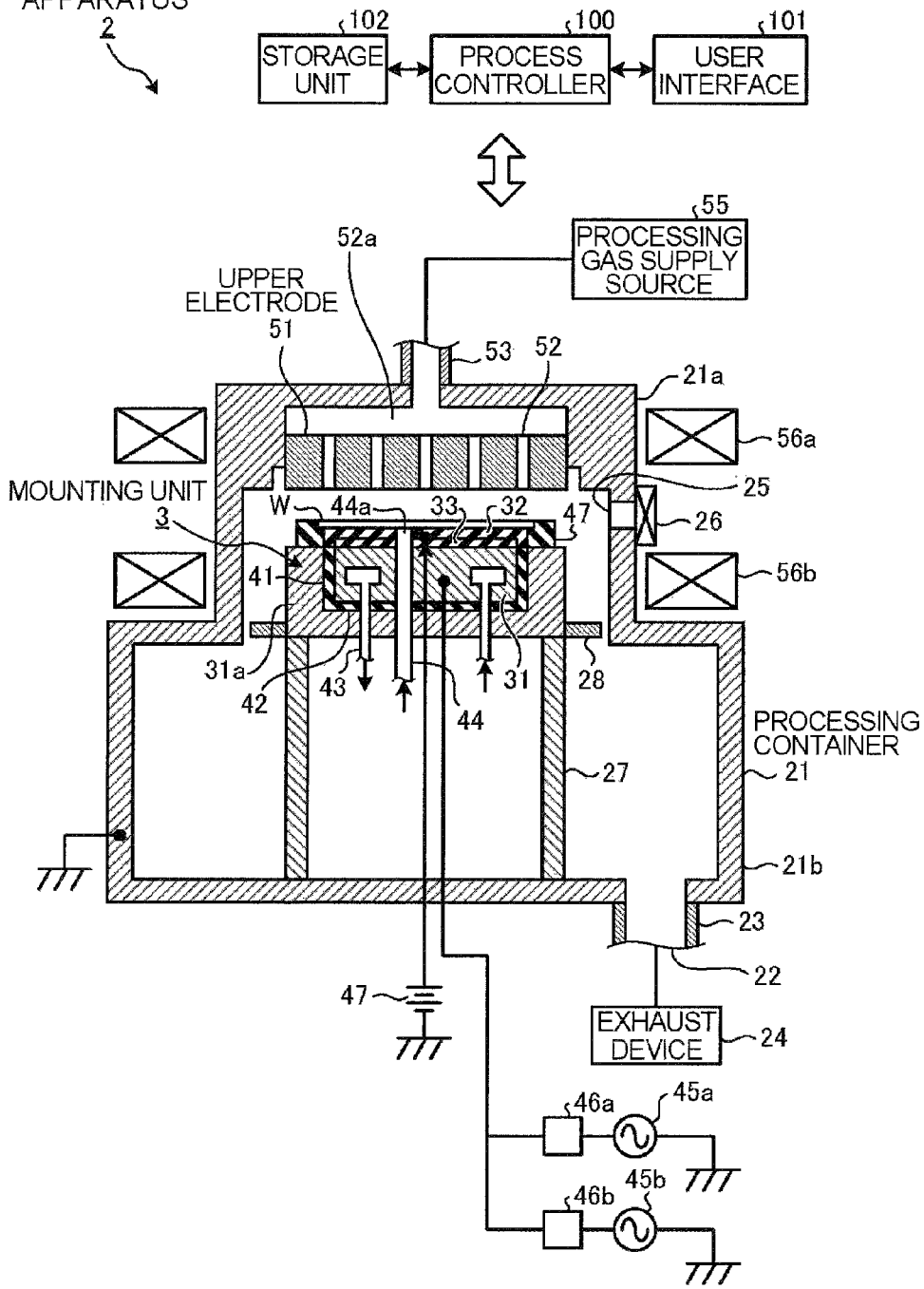

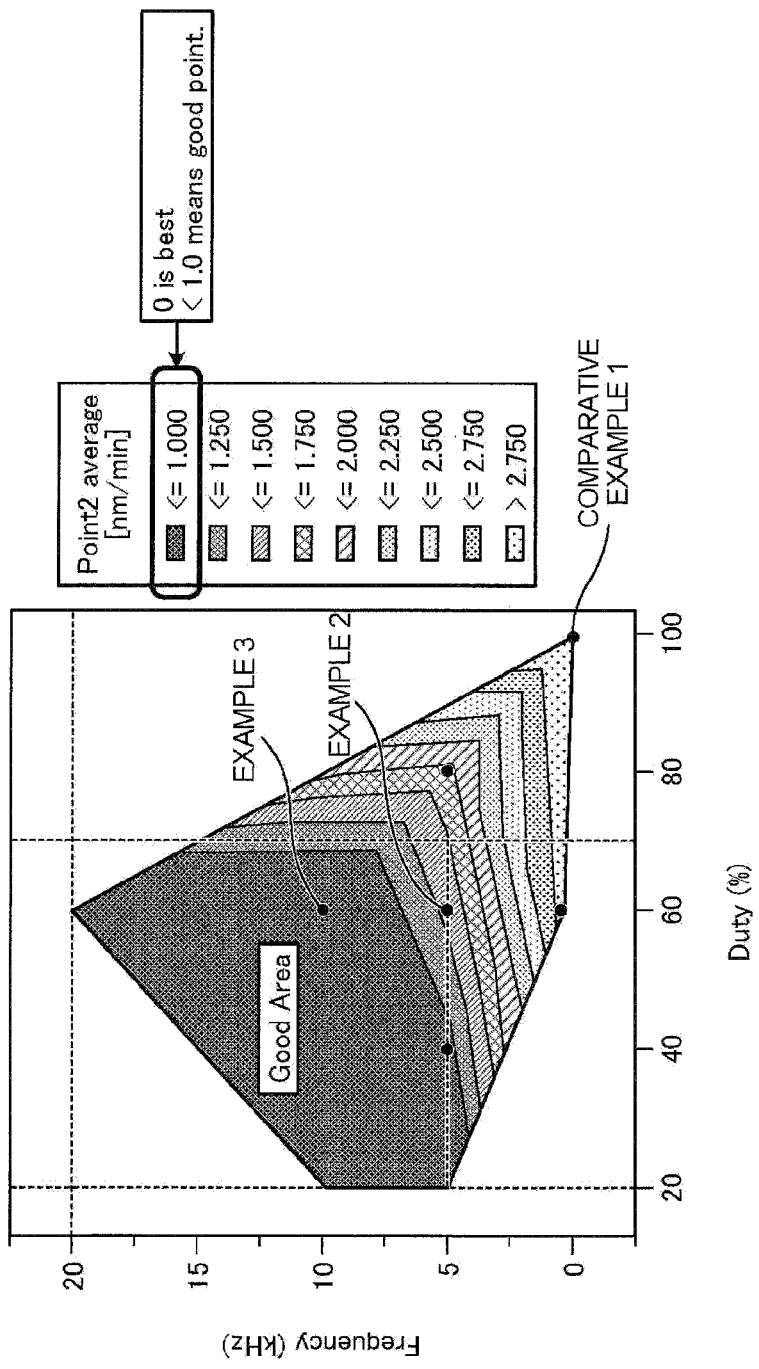

FIG.10A
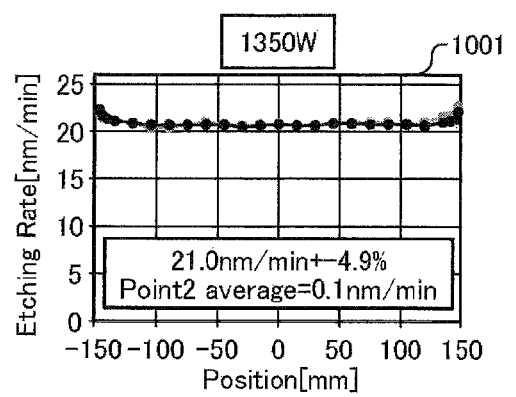
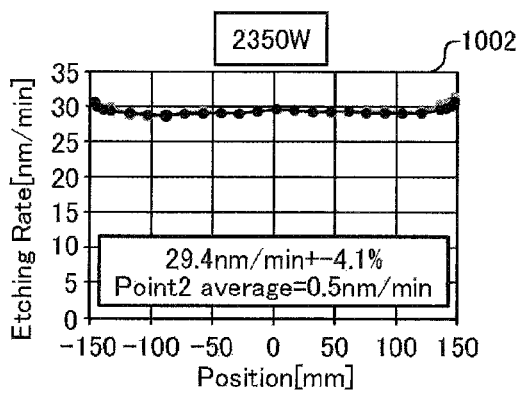
FIG.10B
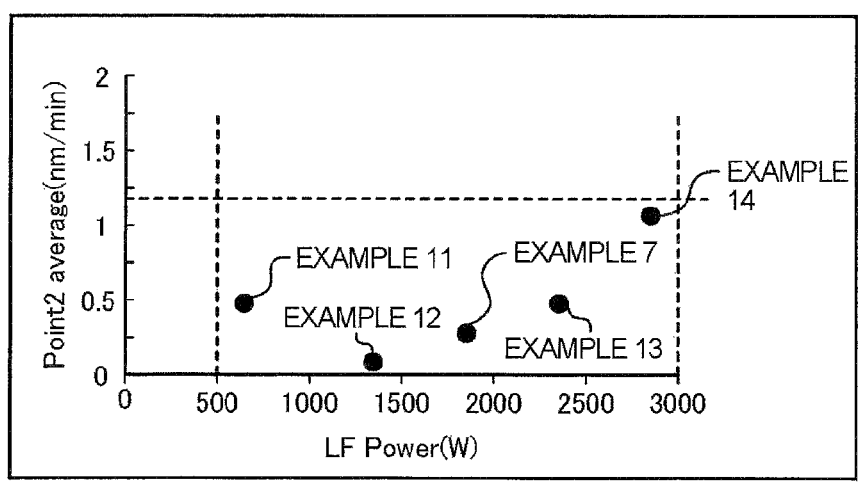

PLASMA PROCESSING METHOD AND PLASMA PROCESSING APPARATUS

CROSS REFERENCE TO RELATED APPLICATION

This application claims priority to U.S. Provisional Application 61/773,925, filed Mar. 7, 2013, and further claims priority to Japanese Application Numbers 2013-029298 and 2014-027549, filed Feb. 18, 2013 and Feb. 17, 2014 respectively, the entire contents of each of which are hereby incorporated by reference.

TECHNICAL FIELD

The present disclosure relates to a plasma processing method and a plasma processing apparatus.

BACKGROUND

In a semiconductor manufacturing process, a plasma processing apparatus which performs plasma processing for the purpose of, for example, deposition, or etching of a thin film, has been widely used. To obtain a high-performance and multi-functional semiconductor, it is desirable to perform a uniform plasma processing on a surface of an object to be processed.

In the recent plasma processing, a plasma processing apparatus which generates plasma of a processing gas using a high frequency power having a relatively high frequency has been used. The plasma processing apparatus supplies a high frequency power of which the frequency is, for example, 100 MHz as a plasma generating power. Further, the plasma processing apparatus supplies a high frequency power having a frequency lower than that of the plasma generating power as a biasing power for implanting ions in the plasma toward the object side to be processed.

However, in the plasma processing apparatus, the plasma density at a central portion of the object to be processed is higher than that at a peripheral portion of the object to be processed. As a result, it has been known to mount a member that makes the plasma density uniform in a mounting unit of the object to be processed. For example, Japanese Patent Application Laid-Open No. 2008-243973 discloses making the plasma density uniform by forming a dielectric layer in a region corresponding to the central portion of the object to be processed inside the mounting unit thereby weakening the electric field supplied from the central portion of the object to be processed to the plasma by the dielectric layer.

SUMMARY

The present disclosure provides a plasma processing method which includes: supplying a processing gas into a processing container in which an object to be processed is disposed; supplying a plasma generating power of a frequency ranging from about 100 MHz to about 150 MHz as a power for generating plasma of the processing gas supplied into the processing container and a biasing power which is a power having a frequency lower than the frequency of the plasma generating power; and etching the object to be processed by the plasma of the processing gas while pulse-modulating the biasing power so that a duty ratio ranges from about 10% to about 70% and the frequency ranges from about 5 kHz to about 20 kHz.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 1 is a schematic cross-sectional view illustrating a plasma processing apparatus which is applied to a plasma processing method according to the present exemplary embodiment.

FIG. 5B is a graph illustrating a verification result (1) of an influence of a duty ratio and a frequency on a center fast profile.

FIG. 10A illustrates graphs of processing results according to Examples 11 to 14.

FIG. 10B illustrates a graph of processing results according to Examples 11 to 14.

DETAILED DESCRIPTION

Figure 2A:
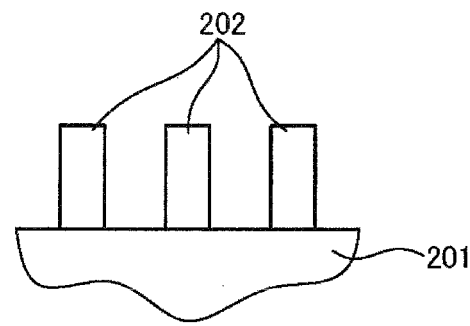
FIG. 2A is a cross-sectional view illustrating a structure example (1) of an object to be processed according to the present exemplary embodiment.

In the following detailed description, reference is made to the accompanying drawing, which form a part hereof. The illustrative exemplary embodiments described in the detailed description, drawing, and claims are not meant to be limiting. Other exemplary embodiments may be utilized, and other changes may be made without departing from the spirit or scope of the subject matter presented here.

The conventional art does not consider maintaining the uniformity of the surface of the object to be processed without having to change the configuration. That is, according to the conventional art, since the plasma density is uniformized by forming the dielectric layer in the region corresponding to the central portion of the object to be processed, the uniformity of the surface of the object to be processed may be maintained but there is a need to change the configuration within the processing apparatus to form the dielectric layer. When the change of the configuration within the processing apparatus is performed, the configuration may be complicated and manufacturing costs may be increased.

In an aspect, a plasma processing method includes: supplying a processing gas into a processing container in which an object to be processed is disposed; supplying a plasma generating power of a frequency ranging from about 100 MHz to about 150 MHz as a power for generating plasma of the processing gas supplied into the processing container and a biasing power which is a power having a frequency lower than the frequency of the plasma generating power; and etching the object to be processed by the plasma of the processing gas while pulse-modulating the biasing power so that a duty ratio ranges from about 10% to about 70% and the frequency ranges from about 5 kHz to about 20 kHz.

Further, in the plasma processing method, in the etching of the object to be processed, the object to be processed is etched by the plasma of the processing gas while the biasing power is pulse-modulated so that the duty ratio ranges from about 40% to about 60% and the frequency ranges from about 5 kHz to about 10 kHz.

Further, in the plasma processing method, the frequency of the biasing power ranges from about 0.4 kHz to about 13.56 MHz.

Further, in the plasma processing method, the object to be processed includes a polysilicon film, and an $SiO_2$ film or an organic film, and in the etching of the object to be processed, the polysilicon film is etched by the plasma of the processing gas using the $SiO_2$ film or the organic film as a mask.

Further, in the plasma processing method, the object to be processed includes an $SiO_2$ film, and an organic film or a polysilicon film, and in the etching of the object to be processed, the $SiO_2$ film is etched by the plasma of the processing gas using the organic film or the polysilicon film as a mask.

Further, in the plasma processing method, the object to be processed includes a layered film of a $SiO_2$ film and a polysilicon film, and an organic film, and in the etching of the object to be processed, the layered film is etched by the plasma of the processing gas using the organic film as a mask.

Further, in the plasma processing method, the layered film is stacked in at least 24 layers.

Further, in the plasma processing method, the processing gas includes bromine or chlorine, fluorine, and oxygen.

Further, in the plasma processing method, the processing gas further includes argon.

Further, in the plasma processing method, the processing gas includes a CF-based gas.

Further, in the plasma processing method, the biasing power ranges from 500 W to 3,000 W.

Further, in the plasma processing method, the difference between the etching rate of a central position of the object to be processed etched by the etching and the etching rate of a position shifted radially by a predetermined distance to the peripheral side from the central position of the object to be processed ranges from −1.2 (nm/min) to 1.2 (nm/min).

In another aspect, a plasma processing apparatus, including: a processing container in which an object to be processed is disposed; an exhaust unit configured to reduce a pressure inside the processing container; a gas supply unit configured to supply a processing gas into the processing container; and a control unit configured to perform a process of supplying the processing gas into the processing container, a process of supplying a plasma generating power of a frequency ranging from about 100 MHz to about 150 MHz as a power for generating plasma of the processing gas supplied into the processing container and a biasing power which is a power having a frequency lower than the frequency of the plasma generating power, and a process of etching the object to be processed by the plasma of the processing gas while pulse-modulating the biasing power so that a duty ratio ranges from about 10% to about 70% and the frequency ranges from about 5 kHz to about 20 kHz.

According to several aspects and embodiments of the present disclosure, it is possible to implement the plasma processing method and the plasma processing apparatus which may widen the setting range of a processing condition, that is, the margin (tolerance) of the processing apparatus or the processing so as to maintain the uniformity of the surface of the object to be processed without changing the configuration, and thus may perform the processing without stopping the apparatus.

Hereinafter, several exemplary embodiments will be described in detail with reference to the accompanying drawings. Further, in each drawing, same or corresponding parts are denoted by same reference numerals.

FIG. 1 is a schematic cross-sectional view illustrating the plasma processing apparatus which is applied to the plasma processing method according to the present exemplary embodiment. FIG. 1 illustrates an example of a reactive ion etching (RIE) plasma processing apparatus. A plasma processing apparatus 2 includes, for example, a processing container 21 which is constituted by a vacuum chamber of which the inside is a sealed space, a mounting unit 3 which is provided at the center of a bottom surface within the processing container 21, and an upper electrode 51 which is provided above the mounting unit 3 so as to face the mounting unit 3.

The processing container 21 includes a cylindrical upper chamber 21a having a small diameter and a cylindrical lower chamber 21b having a large diameter. The upper chamber 21a and the lower chamber 21b communicate with each other and the processing container 21 is configured to be airtight in its entirety. In the upper portion of the upper chamber 21a, the upper electrode 51 is disposed, and the upper chamber 21a accommodates, for example, the mounting unit 3 therein. The lower chamber 21b accommodates a support unit 27 and an exhaust space therein. The support unit 27 supports the mounting unit 3. An exhaust port 22 of a bottom surface of the lower chamber 21b is connected to an exhaust device 24 through an exhaust pipe 23 communicated with the exhaust space. The exhaust device 24 is connected to a pressure adjusting unit (not illustrated). The pressure adjusting unit is configured to vacuum-exhaust the whole inside of the processing container 21 by a signal from a control unit (not illustrated) so as to keep the inside of the processing container 21 at a desired vacuum degree. The exhaust device 24 is an example of an exhaust unit configured to reduce the pressure inside the processing container 21. Meanwhile, a carry-in/out port 25 of a wafer W which is an object to be processed is formed in the side surface of the upper chamber 21a. The carry-in/out port 25 is configured to opened and closed by a gate valve 26. The processing container 21 is made of a conductive member such as, for example, aluminum, and is grounded.

The mounting unit 3 has a structure in which a plasma generating lower electrode 31 which is a conductive member made of, for example, aluminum and a dielectric layer 32 formed to cover an upper surface of the lower electrode 31 are stacked in order from bottom. An electrode film 33 is embedded in the dielectric layer 32. The dielectric layer 32 and the electrode film 33 constitute an electrostatic chuck. Further, the mounting unit 3 includes insulating members 41 and 42. The insulating member 41 covers a side peripheral surface of the lower electrode 31, and the insulating member 42 covers the bottom surface of the lower electrode 31. Through the insulating members 41 and 42, the lower electrode 31 is fixed to a support member 31a provided on the support unit 27 and is in an electrically sufficiently floating state with respect to the processing container 21.

A refrigerant passage 43 through which a refrigerant flows is formed within the lower electrode 31, and is configured such that refrigerant flows in the refrigerant passage 43 so as to cool the lower electrode 31 and cool the wafer W placed on a mounting surface which is an upper surface of the dielectric layer 32, to a desired temperature.

Further, a through hole 44a configured to discharge a backside gas (heat transfer gas) is formed in the dielectric layer 32. The backside gas is discharged to increase thermal conductivity between the mounting surface and a rear surface of the wafer W. The through hole 44a communicates with a gas passage 44 formed, for example, inside of the lower electrode 31, and the backside gas such as, for example, helium (He) supplied from a gas supply unit (not illustrated) is discharged through the gas passage 44.

Further, the lower electrode 31 is connected to a first high frequency power supply 45a which supplies a high frequency power of a frequency ranging from, for example, about 100 MHz to about 150 MHz and a second high frequency power supply 45b which supplies a high frequency power of a frequency ranging from, for example, about 0.4 kHz to about 13.56 MHz, that is, a frequency lower than that of the first high frequency power supply 45a, respectively, through matching devices 46a and 46b. The high frequency power supplied from the first high frequency power supply 45a serves to turn the processing gas to be described below into plasma and the high frequency power supplied from the second high frequency power supply 45b serves to implant ions in the plasma into the surface of the wafer W by applying a bias power to the wafer W. Hereinafter, for convenience of explanation, the high frequency power supplied from the first high frequency power supply 45a may be called a plasma generating power and the high frequency power supplied from the second high frequency power supply 45b may be called a biasing power.

Further, a focus ring 47 is disposed at an outer peripheral portion of the upper surface of the lower electrode 31 to surround the dielectric layer 32. The focus ring 47 serves to adjust the plasma state of a region outside the peripheral portion of the wafer W and for example, serves to widen the plasma than the wafer W to improve uniformity of an etching rate within the surface of the wafer.

A baffle plate 28 is provided at the outside of the lower portion of the support member 31a to surround the support member 31a. The baffle plate 28 serves as a distributer which allows the processing gas within the upper chamber 21a to flow through a gap formed between the baffle plate 28 and a wall portion of the upper chamber 21a to the lower chamber 21b to uniformly exhaust the flow of the processing gas within the upper chamber 21a.

Further, the upper electrode 51 is formed in a hollow shape and in the lower surface thereof, a plurality of gas supply holes 52 constitute a gas shower head. The plurality of gas supply holes 52 are configured to distributedly supply the processing gas into the processing container 21 and formed distributedly so as to uniformly perform the processing. A gas diffusion space 52a is provided at the upper side of the upper electrode 51, and the processing gas is diffused in the gas diffusion space 52a to be supplied to the gas supply holes 52. The gas diffusion space 52a may be divided into a plurality of spaces. Further, a gas introduction pipe 53 is provided at the center of an upper surface of the upper electrode 51 and is connected to a processing gas supply source 55 at the upstream by penetrating the center of the upper surface of the processing container 21. The processing gas supply source 55 has a mechanism (not illustrated) of controlling a supply quantity of a processing gas and is configured to perform a control to stop a supply of the supply quantity of the processing gas to the plasma processing apparatus 2 and increase and reduce the supply quantity of the processing gas. The upper electrode 51, the gas introduction pipe 53, and the processing gas supply source 55 are an example of a gas supply unit configured to supply the processing gas into the processing container 21. Further, the upper electrode 51 is fixed to the wall portion of the upper chamber 21a, such that a conducting path is formed between the upper electrode 51 and the processing container 21.

Further, two multi-pole ring magnets 56a and 56b are disposed at the circumference of the upper chamber 21a above and below the carry-in/out port 25. The multi-pole ring magnets 56a and 56b are disposed so that a plurality of anisotropic segment pillar-shaped magnets are attached to a ring-shaped magnetic casing and directions between the plurality of adjacent segment pillar-shaped magnets are opposite to each other. Therefore, a magnetic line of force is formed between the adjacent segment pillar-shaped magnets and a magnetic field is formed around the processing space between the upper electrode 51 and the lower electrode 31, thereby confining the plasma in the processing space. Further, an apparatus configuration which does not have the multi-pole ring magnets 56a and 56b may be allowed.

Further, each component of the plasma processing apparatus 2 is configured to be controlled by being connected to a process controller 100 including a CPU. The process controller 100 is connected to a user interface 101 which includes, for example, a keyboard or a display. The keyboard allows a process manager to perform, for example, an input operation of a command for managing the plasma processing apparatus 2. The display visualizes and displays an operation situation of the plasma processing apparatus 2.

Further, the process controller 100 is connected to a storage unit 102 which stores a recipe in which, for example, a control program for realizing various processings to be executed in the plasma processing apparatus 2 through control of the process controller 100, or processing condition data are recorded.

Further, any recipe may be called from the storage unit 102 by, for example, a command from the user interface 101 and the process controller 100 may execute the recipe to perform the desired processing in the plasma processing apparatus 2 under the control of the process controller 100. As the recipe, for example, a recipe stored in a computer-readable storage medium, such as, for example, a CD-ROM, a hard disk, a flexible disk, and a flash memory, may be used. Otherwise, a recipe may be used by being frequently transmitted from another apparatus through, for example, a dedicated line. The process controller 100 is also called a "control unit".

For example, the process controller 100 controls each unit of the plasma processing apparatus 2 to perform the plasma processing method to be described below. Hereinafter, a more detailed example will be described. The process controller 100 supplies a processing gas into the processing container 21 from the processing gas supply source 55. Further, the process controller 100 supplies a plasma generating power of a frequency ranging from about 100 MHz to about 150 MHz as a power for generating the plasma of the processing gas supplied into the processing container 21 and a biasing power which is a power having a frequency lower than that of the plasma generating power. Further, the process controller 100 etches the object to be processed by the plasma of the processing gas while pulse-modulating the biasing power so that the duty ratio ranges from about 10% to about 70% and the frequency ranges from about 5 kHz to about 20 kHz. Herein, the pulse modulation of the biasing power includes for example, alternately performing repeatedly the supply and the supply stop of the biasing power. Further, the duty ratio is a ratio of a supply time to a total time of the supply time for supplying the biasing power and a stop time for stopping the supply of the biasing power. Further, the object to be processed is, for example, a wafer W.

FIG. 2A is a cross-sectional view illustrating a structure example (1) of an object to be processed according to the present exemplary embodiment. The object to be processed illustrated in FIG. 2A includes a polysilicon film 201 which is a film to be processed and a $SiO_2$ film 202 as a mask which is linearly formed on the polysilicon film 201. Further, FIG. 2A illustrates an example in which the $SiO_2$ film 202 is formed on the polysilicon film 201, but an organic film may be formed on the polysilicon film 201.

Figure 2B:
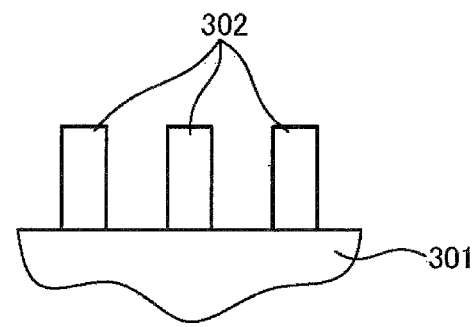
FIG. 2B is a cross-sectional view illustrating a structure example (2) of the object to be processed according to the present exemplary embodiment.

FIG. 2B is a cross-sectional view illustrating a structure example (2) of the object to be processed according to the present exemplary embodiment. The object to be processed illustrated in FIG. 2B includes a $SiO_2$ film 301 which is a film to be processed and an organic film 302 as a mask which is linearly formed on the $SiO_2$ film 301. It is desirable that the organic film 302 is made of, for example, amorphous carbon or SiCO. Further, FIG. 2B illustrates an example in which the organic film 302 is formed on the $SiO_2$ film 301, but a polysilicon film may be formed on the $SiO_2$ film 301.

Figure 2C:
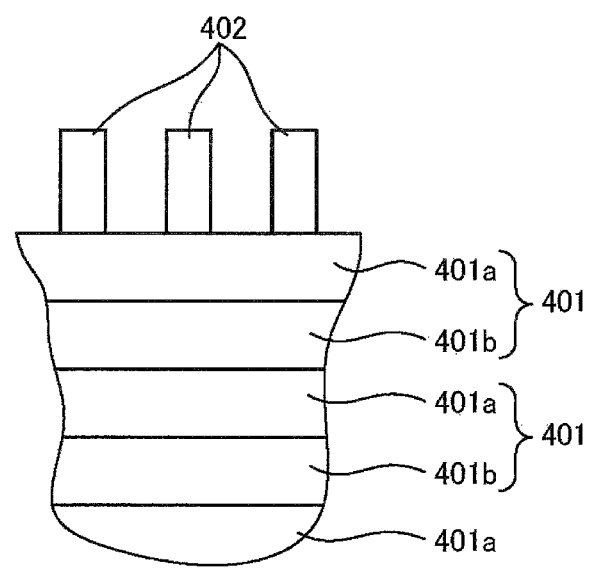
FIG. 2C is a cross-sectional view illustrating a structure example (3) of the object to be processed according to the present exemplary embodiment.

FIG. 2C is a cross-sectional view illustrating a structure example (3) of the object to be processed according to the present exemplary embodiment. The object to be processed illustrated in FIG. 2C includes a plurality of layered films 401 which are films to be processed and an organic film 402 as a mask which is linearly formed on the layered films 401. It is desirable that the organic film 402 is made of, for example, amorphous carbon or SiCO. The layered film 401 is a layered film of a $SiO_2$ film 401a and a polysilicon film 401b. The layered film 401 is formed in at least twenty-four (24) layers.

Figure 3:
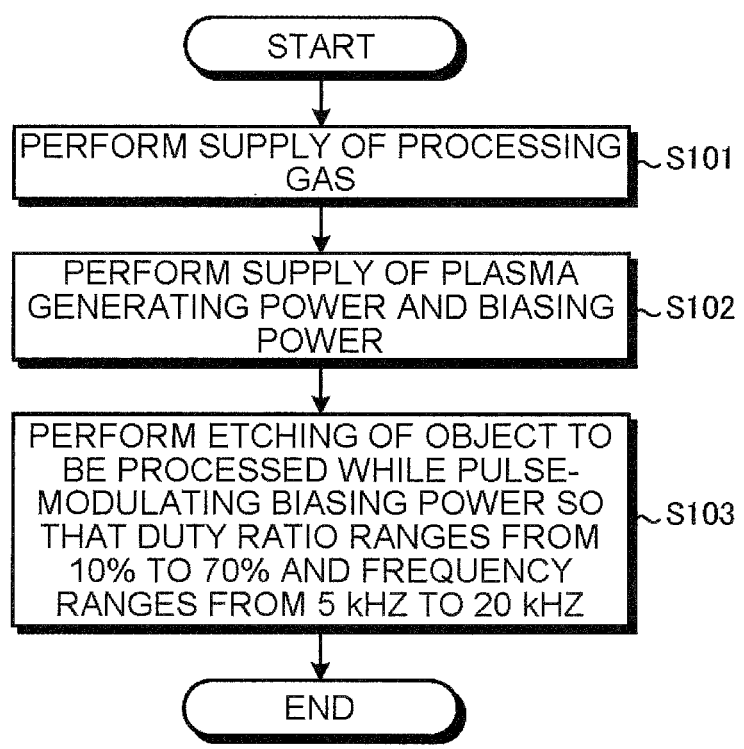
FIG. 3 is a flow chart illustrating an example of a processing flow of the plasma processing method by the plasma processing apparatus according to the present exemplary embodiment.

Next, the plasma processing method by the plasma processing apparatus 2 according to the present exemplary embodiment will be described in more detail. FIG. 3 is a flow chart illustrating an example of a processing flow of the plasma processing method by the plasma processing apparatus according to the present exemplary embodiment.

As illustrated in FIG. 3, the plasma processing apparatus 2 performs a process of supplying a processing gas into the processing container 21 in which an object to be processed is disposed (step S101). For example, the plasma processing apparatus 2 supplies a gas including bromine or chlorine, fluorine, and oxygen as the processing gas into the processing container 21. The gas including bromine or chlorine, fluorine, and oxygen is, for example, $HBr/NF_3/O_2$. Further, the plasma processing apparatus 2 may supply, for example, a CF-based gas as the processing gas into the processing container 21. The CF-based gas is, for example, $CF_4$. When the gas including bromine or chlorine, fluorine, and oxygen is supplied as the processing gas into the processing container 21, the processing gas may further include argon.

The more detailed example will be described. The process controller 100 of the plasma processing apparatus 2 supplies the processing gas into the processing container 21 from the processing gas supply source 55 through the upper electrode 51 as the shower head.

Subsequently, the plasma processing apparatus 2 performs a process of supplying a plasma generating power of a frequency ranging from about 100 MHz to about 150 MHz and a biasing power having a frequency lower than that of the plasma generating power (step S102). Herein, the frequency of the biasing power ranges, for example, from about 0.4 kHz to about 13.56 MHz. The biasing power ranges, for example, from 500 W to 3,000 W.

The more detailed example will be described. The process controller 100 of the plasma processing apparatus 2 supplies the plasma generating power into the processing container 21 from the first high frequency power supply 45a, thereby generating the plasma from the processing gas. Further, the process controller 100 supplies the biasing power to the object to be processed from the second high frequency power supply 45b, thereby implanting ions in the plasma to the object to be processed.

Next, the plasma processing apparatus 2 performs a process of etching the object to be processed by the plasma of the processing gas while pulse-modulating the biasing power so that the duty ratio ranges from about 10% to about 70% and the frequency ranges from about 5 kHz to about 20 kHz (step S103). Preferably, the plasma processing apparatus 2 etches the object to be processed by the plasma of the processing gas while pulse-modulating the biasing power so that the duty ratio ranges from about 20% to about 70% and the frequency ranges from about 5 kHz to about 20 kHz. More preferably, the plasma processing apparatus 2 etches the object to be processed by the plasma of the processing gas while pulse-modulating the biasing power so that the duty ratio ranges from about 40% to about 60% and the frequency ranges from about 5 kHz to about 10 kHz. The difference between the etching rate of a central position of the object to be processed etched by the etching and the etching rate of a position shifted radially by a predetermined distance to the peripheral side from the central position of the object to be processed ranges from −1.2 (nm/min) to 1.2 (nm/min).

For example, a case in which the object to be processed includes a polysilicon film, and a $SiO_2$ film, or an organic film is considered. In this case, the plasma processing apparatus 2 etches the polysilicon film by the plasma of the processing gas using the $SiO_2$ film or the organic film as a mask. Further, for example, a case in which the object to be processed includes a $SiO_2$ film, and an organic film, or a polysilicon film is considered. In this case, the plasma processing apparatus 2 etches the $SiO_2$ film by the plasma of the processing gas using the organic film or the polysilicon film as a mask. Further, for example, a case in which the object to be processed includes a layered film of a $SiO_2$ film and a polysilicon film, and an organic film is considered. In this case, the plasma processing apparatus 2 etches the layered film by the plasma of the processing gas using the organic film as a mask.

Figure 4A:
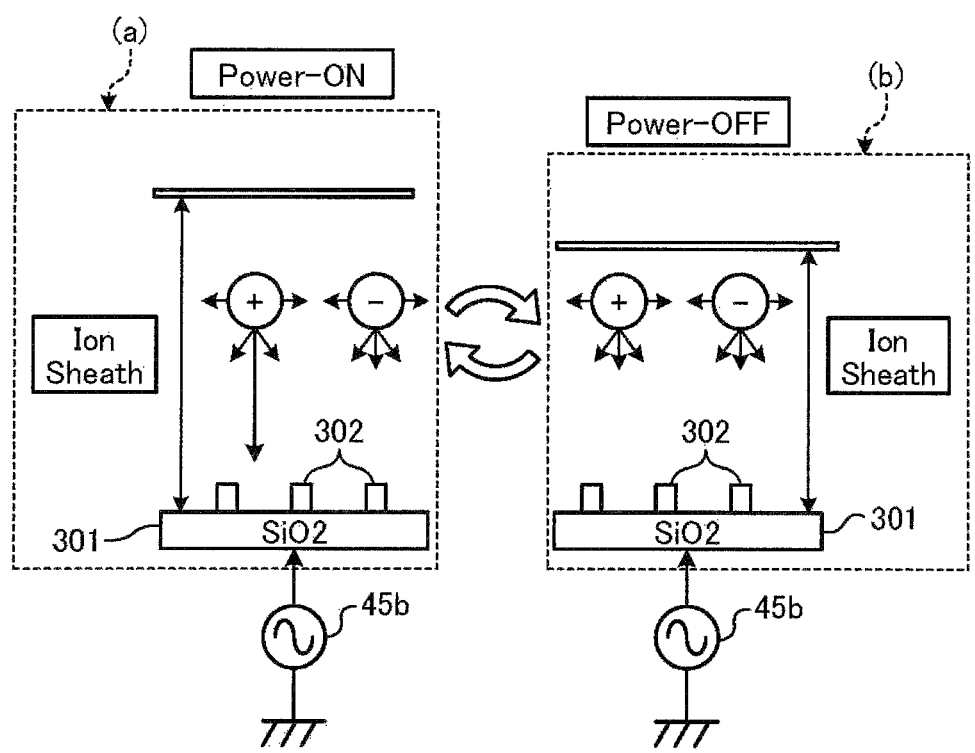
FIG. 4A is a diagram illustrating an example of an etching process according to the present exemplary embodiment.
Figure 4B:
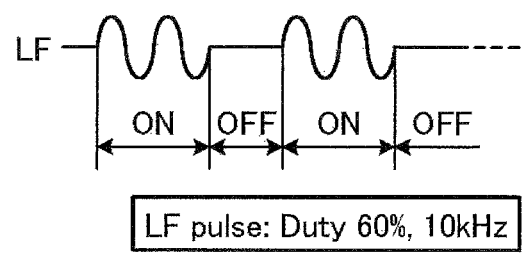
FIG. 4B is a diagram illustrating an example of an etching process according to the present exemplary embodiment.

FIGS. 4A and 4B are diagrams illustrating an example of the etching process according to the present exemplary embodiment. Further, in the example of FIGS. 4A and 4B, the object to be processed includes the SiO$_2$ film 301 which is the film to be processed and the organic film 302 as the mask which is linearly formed on the SiO$_2$ film 301 as illustrated in FIG. 2B. The process controller 100 of the plasma processing apparatus 2 supplies the biasing power from the second high frequency power supply 45b to the wafer W and pulse-modulates the biasing power so that the duty ratio becomes about 60% and the frequency becomes about 10 kHz. That is, as illustrated in FIG. 4B, the process controller 100 pulse-modulates the biasing power through on-off control of the second high frequency power supply 45b so that the duty ratio becomes about 60% and the frequency becomes about 10 kHz when positive ions or negative ions in the plasma are implanted toward the object to be processed.

As a result, when the second high frequency power supply 45b is turned on, as illustrated in (a) part of FIG. 4A, a collision of the positive ion and the negative ion with the SiO$_2$ film 301 on the object to be processed is accelerated and a thickness of an ion sheath on the object to be processed is increased. Meanwhile, when the second high frequency power supply 45b is turned off, as illustrated in (b) part of FIG. 4A, the collision of the positive ion and the negative ion with the SiO$_2$ film 301 on the object to be processed is suppressed and the thickness of the ion sheath on the object to be processed is reduced. The second high frequency power supply 45b which supplies the biasing power is controlled to be turned on/off, such that the state of the ion sheath illustrated in the (a) part of FIG. 4A and the state of the ion sheath illustrated in the (b) part of FIG. 4A are alternately repeated. By doing so, a growth of the ion sheath on the object to be processed is suppressed. In particular, the growth of the ion sheath formed in the region corresponding to the central portion of the object to be processed is suppressed, compared with the growth of the ion sheath formed in the region corresponding to the peripheral portion of the object to be processed. As a result, the plasma density at the central portion of the object to be processed and the plasma density at the peripheral portion of the object to be processed are appropriately uniformized, such that the uniformity of the surface to be processed of the SiO$_2$ film 301 on the object to be processed may be maintained. For example, a critical dimension (CD) which is the width of a hole formed in the SiO$_2$ film 301 on the object to be processed is uniformized from the central portion to the peripheral portion of the object to be processed.

In the description with reference to FIGS. 4A and 4B, the object to be processed is an object to be processed illustrated in FIG. 2B, but the present disclosure is not limited thereto. The object to be processed may be an object to be processed illustrated in FIG. 2A or an object to be processed illustrated in FIG. 2C. First, the object to be processed may be assumed to be the object to be processed as illustrated in FIG. 2A, in which the object to be processed includes a polysilicon film 201 which is a film to be processed and a SiO$_2$ film 202 as a mask which is linearly formed on the polysilicon film 201. In this case, when the etching process in the present exemplary embodiment is performed, a CD which is a width of a hole formed in the SiO$_2$ film 201 on the object to be processed is uniformized from the central portion to the peripheral portion of the object to be processed.

For example, the object to be processed may be assumed to be the object to be processed as illustrated in FIG. 2C, in which the object to be processed includes a plurality of layered films 401 which are films to be processed and an organic film 402 as a mask which is linearly formed on the layered films 401. In this case, when the etching process in the present exemplary embodiment is performed, a CD which is a width of a hole formed in the layered films 401 on the object to be processed is uniformized from the central portion to the peripheral portion of the object to be processed.

As described above, according to the present exemplary embodiment, the process of supplying a processing gas into the processing container 21, the process of supplying a plasma generating power of a frequency ranging from about 100 MHz to about 150 MHz and supplying a biasing power, and the process of etching an object to be processed by the plasma of the processing gas while pulse-modulating the biasing power so that the duty ratio ranges from about 10% to about 70% and the frequency ranges from about 5 kHz to about 20 kHz are performed. For this reason, the plasma density at the central portion of the object to be processed and the plasma density at the peripheral portion of the object to be processed are appropriately uniformized. As a result, the setting range of the processing condition, that is, the margin (tolerance) of the processing apparatus or the processing may be widened so as to maintain the uniformity of the surface of the object to be processed without having to change the configuration, and thus, it is possible to perform the processing without stopping the apparatus.

Further, according to the present exemplary embodiment, in the etching process, the object to be processed is etched by the plasma of the processing gas while the biasing power is pulse-modulated so that preferably, the duty ratio ranges from about 20% to about 60% and the frequency ranges from about 5 kHz to about 20 kHz. As a result, the setting range of the processing condition, that is, the margin (tolerance) of the processing apparatus or the processing may be widened so as to maintain the uniformity of the surface of the object to be processed at better precision, and thus it is possible to perform the processing without stopping the apparatus.

Further, according to the present exemplary embodiment, in the etching process, the object to be processed is etched by the plasma of the processing gas while the biasing power is pulse-modulated so that more preferably, the duty ratio ranges from about 40% to about 60% and the frequency ranges from about 5 kHz to about 20 kHz. As a result, the setting range of the processing condition, that is, the margin (tolerance) of the processing apparatus or the processing may be widened so as to maintain the uniformity of the surface of the object to be processed at better precision, and thus it is possible to perform the processing without stopping the apparatus.

Further, according to the present exemplary embodiment, the frequency of the biasing power ranges from about 0.4 kHz to about 13.56 MHz. As a result, since the ions in the plasma may be implanted with good efficiency, the setting range of the processing condition, that is, the margin (tolerance) of the processing apparatus or the processing may be widened so as to maintain the uniformity of the surface of the object to be processed at better precision, and thus, it is possible to perform the processing without stopping the apparatus.

Further, according to the present exemplary embodiment, the object to be processed includes the polysilicon film, and the SiO$_2$ film or the organic film and in the etching process, the polysilicon film is etched by the plasma of the processing gas using the SiO$_2$ film or the organic film as the mask. As a result, the setting range of the processing condition, that is, the margin (tolerance) of the processing apparatus or the processing may be widened so as to maintain the uniformity of the surface to be processed of the polysilicon film on the object to be processed, and thus, it is possible to perform the processing without stopping the apparatus.

Further, according to the present exemplary embodiment, the object to be processed includes the $SiO_2$ film, and the organic film or the polysilicon film and in the etching process, the $SiO_2$ film is etched by the plasma of the processing gas using the organic film or the polysilicon film as the mask. As a result, the setting range of the processing condition, that is, the margin (tolerance) of the processing apparatus or the processing may be widened so as to maintain the uniformity of the surface to be processed of the $SiO_2$ film on the object to be processed, and thus, it is possible to perform the processing without stopping the apparatus.

Further, according to the present exemplary embodiment, the object to be processed includes the layered film of the $SiO_2$ film and the polysilicon film, and the organic film and in the etching process, the layered film is etched by the plasma of the processing gas using the organic film as the mask. As a result, the setting range of the processing condition, that is, the margin (tolerance) of the processing apparatus or the processing may be widened so as to maintain the uniformity of the surface to be processed of the layered film on the object to be processed, and thus, it is possible to perform the processing without stopping the apparatus.

Further, according to the present exemplary embodiment, the layered film is stacked in at least 24 layers. As a result, the setting range of the processing condition, that is, the margin (tolerance) of the processing apparatus or the processing may be widened so as to maintain the uniformity of the surface to be processed of the layered films stacked in at least 24 layers on the object to be processed, and thus, it is possible to perform the processing without stopping the apparatus.

Further, according to the present exemplary embodiment, the processing gas includes bromine or chlorine, fluorine, and oxygen. As a result, the setting range of the processing condition, that is, the margin (tolerance) of the processing apparatus or the processing may be widened so as to maintain the uniformity of the surface of the object to be processed at better precision, and thus, it is possible to perform the processing without stopping the apparatus.

Further, according to the present exemplary embodiment, the processing gas further includes argon. As a result, it is possible to control the etching rate and the CD at the central portion of the object to be processed to required values by simply varying the flow rate of argon without requiring changes in the configuration.

Further, according to the present exemplary embodiment, the processing gas includes the CF-based gas. As a result, the setting range of the processing condition, that is, the margin (tolerance) of the processing apparatus or the processing may be widened so as to maintain the uniformity of the surface of the object to be processed at better precision, and thus, it is possible to perform the processing without stopping the apparatus.

Further, according to the present exemplary embodiment, the biasing power ranges from 500 W to 3,000 W. As a result, it is possible to control the etching rate and the CD at the central portion of the object to be processed to required values.

According to the present exemplary embodiment, the difference between the etching rate of a central position of the object to be processed etched by the etching, and the etching rate of a position shifted radially by a predetermined distance to the peripheral side from the central position of the object to be processed ranges from −1.2 (nm/min) to 1.2 (nm/min). As a result, it is possible to control the etching rate and the CD at the central portion of the object to be processed to required values at good precision.

EXAMPLES

Hereinafter, the disclosed plasma processing method will be described in more detail with reference to Examples. However, the disclosed plasma processing method is not limited to the following Examples.

Comparative Example 1

In Comparative Example 1, a series of plasma processing processes which perform a gas supplying process, a power supplying process, and an etching process in order were performed on the object to be processed. The plasma processing processes were performed using the following conditions. The object to be processed having the following structure was used.

(Object to be Processed)
Film to be processed: $SiO_2$ film
Mask: Polysilicon film
(Plasma Processing Process)
Processing gas: $HBr/NF_3/O_2$=300/34/24 sccm
High frequency power (plasma generating power) from first high frequency power supply: 800 W
Frequency of plasma generating power: 100 MHz
High frequency power (biasing power) from second high frequency power supply: 600 W
Frequency of biasing power: 13.56 MHz
Pulse modulation on biasing power: No performance
Duty ratio of biasing power after pulse modulation: 100%
Frequency of biasing power after pulse modulation: 0 kHz
Temperature (upper electrode/inner wall of processing container/lower electrode): 80/70/60° C.

Example 1

In Example 1, in the plasma processing process, the object to be processed was etched by the plasma of the processing gas while the biasing power was pulse-modulated using the following conditions. Other aspects are the same as Comparative Example 1.
Pulse modulation on biasing power: Performance
Duty ratio of biasing power after pulse modulation: 60%
Frequency of biasing power after pulse modulation: 5 kHz Example 2

In Example 2, in the plasma processing process, as the biasing power, the following conditions were used. Other aspects are the same as Example 1.
High frequency power (biasing power) from second high frequency power supply: 1000 W Example 3

In Example 3, in the plasma processing process, as the biasing power, the following condition was used and as the frequency of the biasing power after the pulse modulation, the following condition was used. Other aspects are the same as Example 1.
High frequency power (biasing power) from second high frequency power supply: 1000 W Frequency of biasing power after pulse modulation: 10 kHz (Processing Results According to Comparative Example 1 and Examples 1 to 3)

Figure 5A:
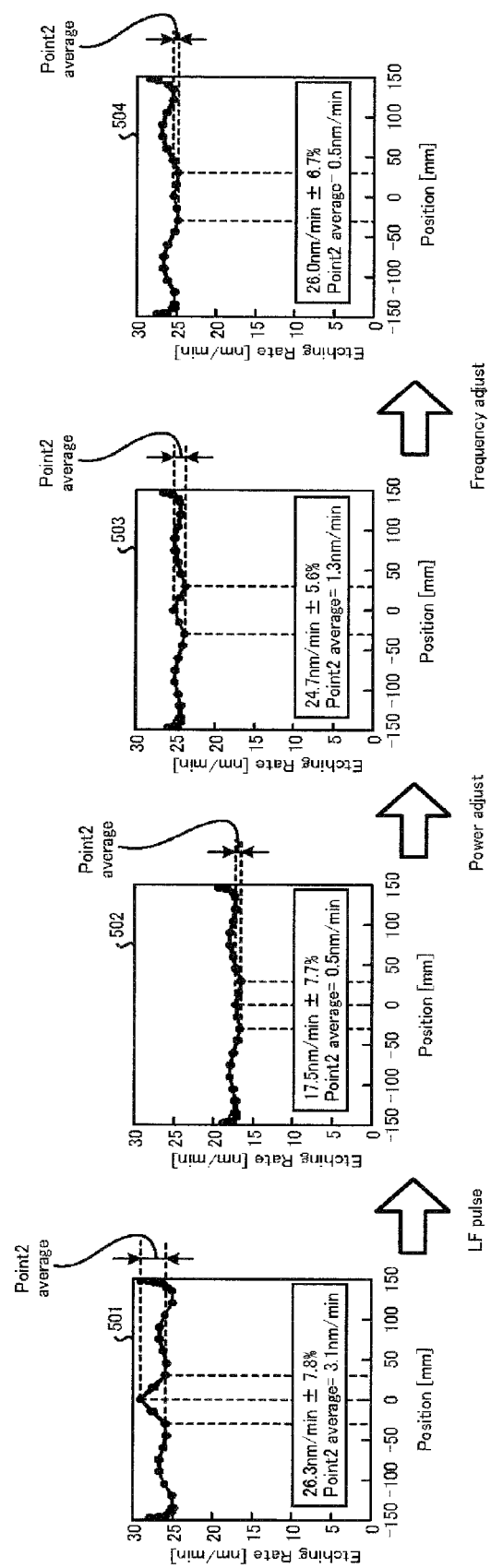
FIG. 5A illustrates graphs of processing results according to Comparative Example 1 and Examples 1 to 3.

FIG. 5A illustrates graphs of processing results according to Comparative Example 1 and Examples 1 to 3. Graphs 501 to 504 of FIG. 5A illustrate etching rates of the objects to be processed in Comparative Example 1 and Examples 1 to 3, respectively. In Graphs 501 to 504, the vertical axis represents an etching rate (nm/min) when the $SiO_2$ film of the object to be processed was etched by the plasma of $HBr/NF_3/O_2$. Further, in Graphs 501 to 504, the horizontal axis represents a position in a radial direction of the object to be processed. That is, Graphs 501 to 504 illustrate the etching rates from a peripheral position "−150 (mm)" from a central position of the object to be processed to a peripheral position "+150 (mm)" when the central position of the object to be processed is set to be "0".

Further, in FIG. 5A, "Point2 average" represents a difference between the etching rate of the central position of the object to be processed and the etching rate of a position shifted radially by ±30 mm to the peripheral side from the central position of the object to be processed. The "Point2 average" of a predetermined value (for example 1.2) or more represents that a center fast profile in which the etching rate of the central portion of the object to be processed is excessively higher than that of the peripheral portion of the object to be processed occurs. Accordingly, the setting range of the processing condition, that is, the margin (tolerance) of the processing apparatus or the processing may be widened so that "Point2 average" may be 1.2 or less to maintain the uniformity of the surface of the object to be processed at good precision, and thus, it is possible to perform the processing without stopping the apparatus.

As illustrated in FIG. 5A, in Comparative Example 1 in which the biasing power was not pulse-modulated, an average of the etching rates at plural positions in the radial direction of the object to be processed was 26.3 nm/min and a variation in the average etching rate was ±7.8%. Any of the average etching rate and the variation did not satisfy predefined allowable specifications. Further, in Comparative Example 1, the "Point2 average" was 3.1 nm/min. The "Point2 average" was a value which represents that the center fast profile occurred.

On the other hand, in Example 1 in which the biasing power was pulse-modulated so that the duty ratio became 60% and the frequency became 5 kHz, an average of the etching rates at plural positions in the radial direction of the object to be processed was 17.5 nm/min and a variation in the average etching rate was ±7.7%. Both the average etching rate and the variation satisfied the predefined allowable specifications. Further, in Example 1, the "Point2 average" was 0.5 nm/min. The "Point2 average" was a value which represents that the level of the center fast profile was more reduced compared with Comparative Example 1. That is, compared with Comparative Example 1, in Example 1, the difference between the etching rate of the peripheral portion of the object to be processed and the etching rate of the central portion of the object to be processed was smaller.

In Example 2 using the biasing power higher than that of Example 1, an average of the etching rates at plural positions in the radial direction of the object to be processed was 24.7 nm/min and a variation in the average etching rate was ±5.6%. Both the average etching rate and the variation satisfied the predefined allowable specifications. Further, in Example 2, the "Point2 average" was 1.3 nm/min. The "Point2 average" was a value which represents that the level of the center fast profile was more reduced compared with Comparative Example 1. That is, compared with Comparative Example 1, in Example 2, the difference between the etching rate of the peripheral portion of the object to be processed and the etching rate of the central portion of the object to be processed was smaller.

In Example 3 in which the biasing power and the frequency after the pulse-modulation were higher than those of Example 1, an average of the etching rates at plural positions in the radial direction of the object to be processed was 26.0 nm/min and a variation in the average etching rate was ±6.7%. Both the average etching rate and the variation satisfied the predefined allowable specifications. Further, in Example 3, the "Point2 average" was 0.5 nm/min. The "Point2 average" was a value which represents that the level of the center fast profile was more reduced compared with Comparative Example 1 and was a value equal to that of Example 1. That is, compared with Comparative Example 1, in Example 3, the difference between the etching rate of the peripheral portion of the object to be processed and the etching rate of the central portion of the object to be processed was smaller and maintained at the value equal to that of Example 1.

As described above, as may be appreciated from the comparison of Comparative Example 1 with Examples 1 to 3, in Examples 1 to 3, unlike in the method which does not pulse-modulate the biasing power, it is possible to improve the uniformity of the surface of the object to be processed by etching the object to be processed by the plasma of the processing gas while pulse-modulating the biasing power.

(Verification Result (1) of Influence of Duty Ratio and Frequency on Center Fast Profile)

FIG. 5B is a graph illustrating a verification result (1) of an influence of a duty ratio and a frequency on a center fast profile. In FIG. 5B, the horizontal axis represents the duty ratio % of the biasing power after the pulse modulation and the vertical axis represents the frequency (kHz) of the biasing power after the pulse modulation. Further, in FIG. 5B, the "Point2 average" represents a difference between the etching rate of the central position of the object to be processed and the etching rate of a position shifted radially by ±30 mm from the central position of the objected to be processed. Further, FIG. 5B illustrates all the measuring points corresponding to Comparative Example 1, Example 2, and Example 3, respectively.

As illustrated in FIG. 5B, in Comparative Example 1 in which the biasing power was not pulse-modulated, since the "Point2 average" is greater than 1.2 nm/min, it may be appreciated that the level of the center fast profile is relatively large. On the other hand, in Example 2 and Example 3 in which the biasing power was pulse-modulated, since the "Point 2 average" is 1.2 nm/min or less, it may be appreciated that the level of the center fast profile is more reduced compared with Comparative Example 1. For this reason, the present inventors measured the "Point2 average" on a plural of measurement points which are present around measurement points corresponding to Example 2 and Example 3, respectively. As a result of the measurement, when the biasing power is pulse-modulated so that the duty ratio ranges from 10% to 70% and the frequency ranges from 5 kHz to 20 kHz, the "Point2 average" is 1.2 nm/min or less. Further, compared with the case in which the biasing power is pulse-modulated so that the duty ratio ranges from 10% to 70% and the frequency ranges from 5 kHz to 20 kHz, in the case in which the biasing power is pulse-modulated so that the duty ratio ranges from 40% to 60% and the frequency ranges from 5 kHz to 10 kHz, the "Point2 average" is reduced. That is, it was confirmed that the level of the center fast profile is reduced when the biasing power is pulse-modulated so that the duty ratio ranges from 10% to 70% and the frequency ranges from 5 kHz to 20 kHz, preferably, so that the duty ratio ranges from 40 to 60% and the frequency ranges from 5 kHz to 10 kHz.

Comparative Example 2

In Comparative Example 2, a series of plasma processing processes which perform a gas supplying process, a power supplying process, and an etching process in order were performed on the object to be processed. The plasma processing processes were performed using the following conditions. The object to be processed having the following structure was used.
(Object to be Processed)
Film to be processed: $SiO_2$ film
Mask: Polysilicon film
(Plasma Processing Process)
Processing gas: $CF_4$=100 sccm
High frequency power (plasma generating power) from first high frequency power supply: 600 W
Frequency of plasma generating power: 100 MHz
High frequency power (biasing power) from second high frequency power supply: 600 W
Frequency of biasing power: 13.56 MHz
Pulse modulation on biasing power: No performance
Duty ratio of biasing power after pulse modulation: 100%
Frequency of biasing power after pulse modulation: 0 kHz
Temperature (upper electrode/inner wall of processing container/lower electrode): 80/70/60° C.

Example 4

In Example 4, in the plasma processing process, the object to be processed was etched by the plasma of the processing gas while the biasing power was pulse-modulated using the following conditions. Other aspects are the same as Comparative Example 2.
Pulse modulation on biasing power: Performance
Duty ratio of biasing power after pulse modulation: 60%
Frequency of biasing power after pulse modulation: 10 kHz Example 5

Figure 6:
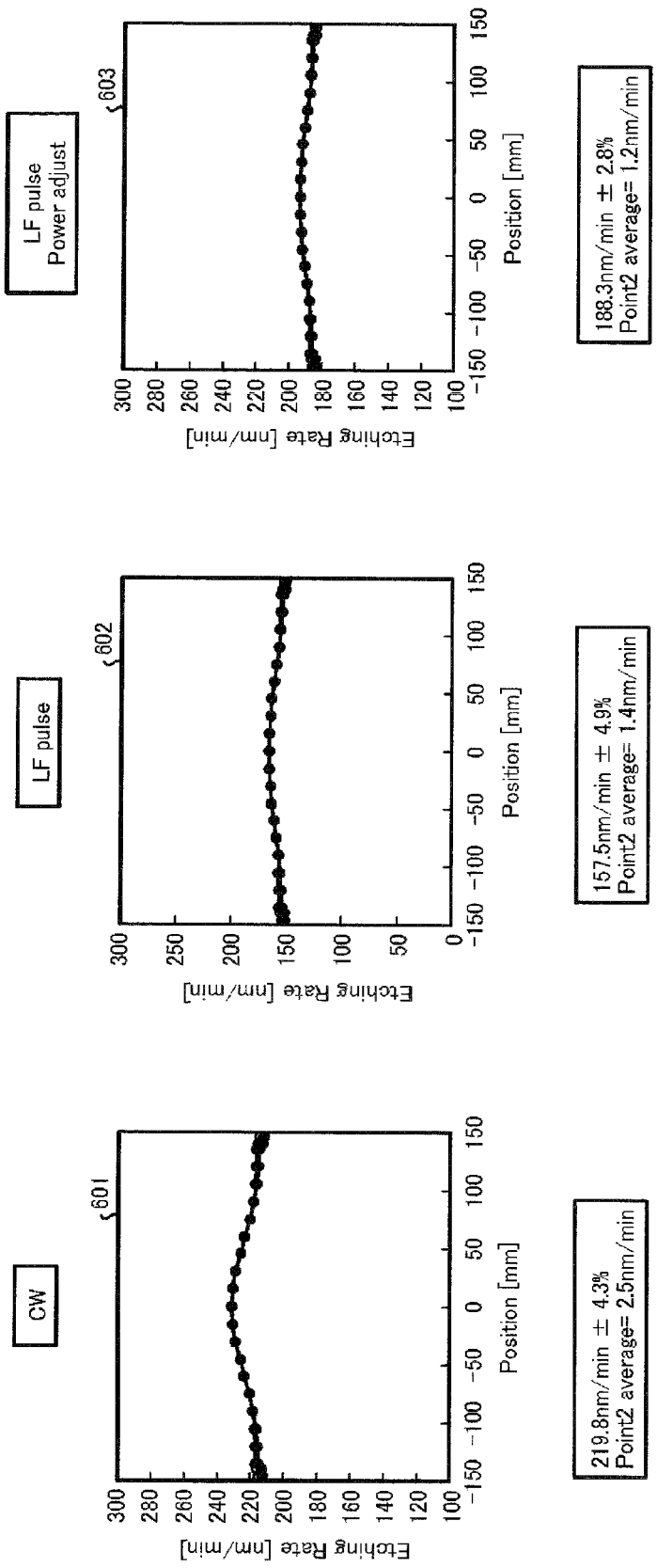
FIG. 6 illustrates graphs of processing results according to Comparative Example 2 and Examples 4 and 5.

In Example 5, in the plasma processing process, as the biasing power, the following condition was used. Other aspects are the same as Example 4.
High frequency power (biasing power) from second high frequency power supply: 1000 W
(Processing Results According to Comparative Example 2 and Examples 4 and 5)
FIG. 6 illustrates graphs of processing results according to Comparative Example 2 and Examples 4 and 5. Graphs 601 to 603 of FIG. 6 illustrate etching rates of the processing results according to Comparative Example 2 and Examples 4 and 5, respectively. In Graphs 601 to 603, the vertical axis illustrates an etching rate [nm/min] when the $SiO_2$ film of the object to be processed was etched by the plasma of $CF_4$. Further, in Graphs 601 to 603, the horizontal axis represents a position in a radial direction of the object to be processed. That is, Graphs 601 to 603 illustrate the etching rates from a peripheral position "−150 (mm)" from a central position of the object to be processed to a peripheral position "+150 (mm)" when the central position of the object to be processed is set to be "0".

Further, in FIG. 6, the "Point2 average" represents the difference between the etching rate of the central position of the object to be processed and the etching rate of a position shifted radially by ±30 mm from the central position of the objected to be processed. The "Point2 average" of a predetermined value (for example 1.2) or more represents that a center fast profile in which the etching rate of the central portion of the object to be processed is excessively higher than that of the peripheral portion of the object to be processed occurs.

As illustrated in FIG. 6, in Comparative Example 2 in which the biasing power was not pulse-modulated, an average of the etching rates at plural positions in the radial direction of the object to be processed was 219.8 nm/min and a variation in the average etching rate was ±4.3%. Any of the average etching rate and the variation did not satisfy predefined allowable specifications. Further, in Comparative Example 2, the "Point2 average" was 2.5 nm/min. The "Point2 average" was a value which represents that the center fast profile in which the etching rate of the central portion of the object to be processed is excessively higher than that of the peripheral portion of the object to be processed occurred.

On the other hand, in Example 4 in which the biasing power was pulse-modulated so that the duty ratio became 60% and the frequency became 10 kHz, an average of the etching rates at plural positions in the radial direction of the object to be processed was 157.5 nm/min and a variation in the average etching rate was ±4.9%. Both the average etching rate and the variation satisfied the predefined allowable specifications. Further, in Example 4, the "Point2 average" was 1.4 nm/min. The "Point2 average" was a value which represents that the level of the center fast profile was more reduced compared with Comparative Example 2. That is, compared with Comparative Example 2, in Example 4, the difference between the etching rate of the peripheral portion of the object to be processed and the etching rate of the central portion of the object to be processed was smaller.

In Example 5 using the biasing power higher than that of Example 4, an average of the etching rates at plural positions in the radial direction of the object to be processed was 188.3 nm/min and a variation in the average etching rate was ±2.8%. Both the average etching rate and the variation satisfied the predefined allowable specifications. Further, in Example 5, the "Point2 average" was 1.2 nm/min. The "Point2 average" was a value which represents that the level of the center fast profile was more reduced compared with Comparative Example 2. That is, compared with Comparative Example 2, in Example 5, the difference between the etching rate of the peripheral portion of the object to be processed and the etching rate of the central portion of the object to be processed was smaller.

As described above, as may be appreciated from the comparison of Comparative Example 2 with Examples 4 and 5, in Examples 4 and 5, unlike in the method which does not pulse-modulate the biasing power, it is possible to improve the uniformity of the surface of the object to be processed by etching the object to be processed by the plasma of the processing gas while pulse-modulating the biasing power.

Comparative Example 3

In Comparative Example 3, a plasma processing process of performing an etching process of the polysilicon film stepwise in two steps was performed on the object to be processed. That is, in the first step, polysilicon is etched up to the middle of a predetermined depth by the plasma and in the second step, the polysilicon is etched up to the predetermined depth by the plasma. In the plasma processing process, the etching was performed stepwise in the two steps using the following conditions. The object to be processed having the following structure was used.

(Object to be Processed)
Film to be processed: Polysilicon film
Mask: $SiO_2$ film
(Plasma Processing Process)
(First Step)
Processing gas: $HBr/NF_3/O_2$=300/28/17 sccm
High frequency power (plasma generating power) from first high frequency power supply: 800 W
Frequency of plasma generating power: 100 MHz
High frequency power (biasing power) from second high frequency power supply: 1000 W
Frequency of biasing power: 13.56 MHz
Pulse modulation on biasing power: No performance
Duty ratio of biasing power after pulse modulation: 100%
Frequency of biasing power after pulse modulation: 0 kHz
Temperature (upper electrode/inner wall of processing container/lower electrode): 80/70/60° C.
(Second Step)
Processing gas: $HBr/NF_3/O_2$=300/34/15 sccm
High frequency power (plasma generating power) from first high frequency power supply: 800 W
Frequency of plasma generating power: 100 MHz
High frequency power (biasing power) from second high frequency power supply: 1000 W
Frequency of biasing power: 13.56 MHz
Pulse modulation on biasing power: No performance
Duty ratio of biasing power after pulse modulation: 100%
Frequency of biasing power after pulse modulation: 0 kHz
Temperature (upper electrode/inner wall of processing container/lower electrode): 80/70/60° C.

Example 6

In Example 6, in the first step and the second step of the plasma processing process, the object to be processed was etched by the plasma of the processing gas while the biasing power was pulse-modulated using the following conditions. Other aspects are the same as Comparative Example 3.
Pulse modulation on biasing power: Performance
Duty ratio of biasing power after pulse modulation: 60%
Frequency of biasing power after pulse modulation: 10 kHz
(Processing results according to Comparative Example 3 and Example 6)

Figure 7A:
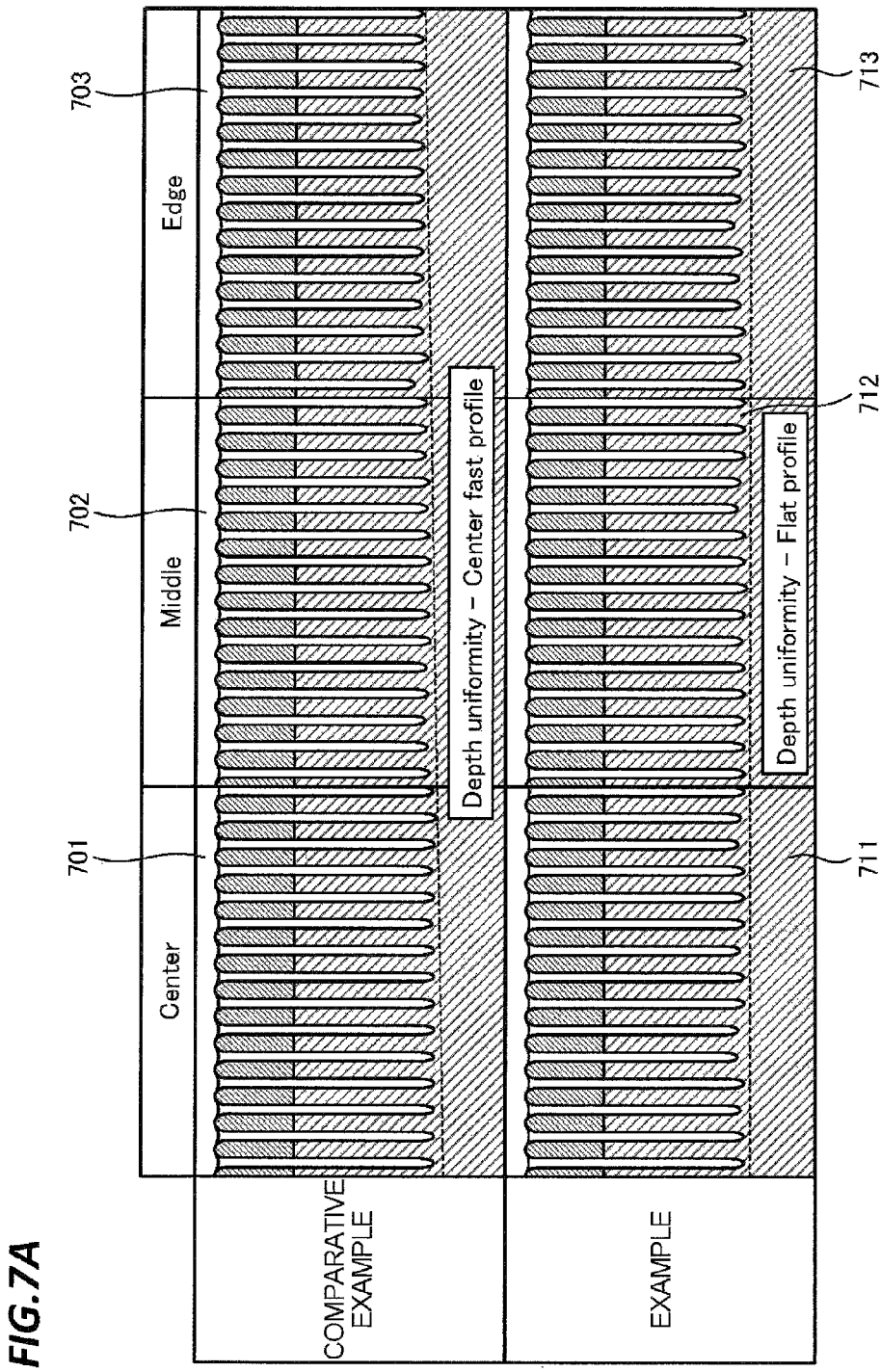
FIG. 7A is a diagram illustrating processing results according to Comparative Example 3 and Example 6.
Figure 7B:
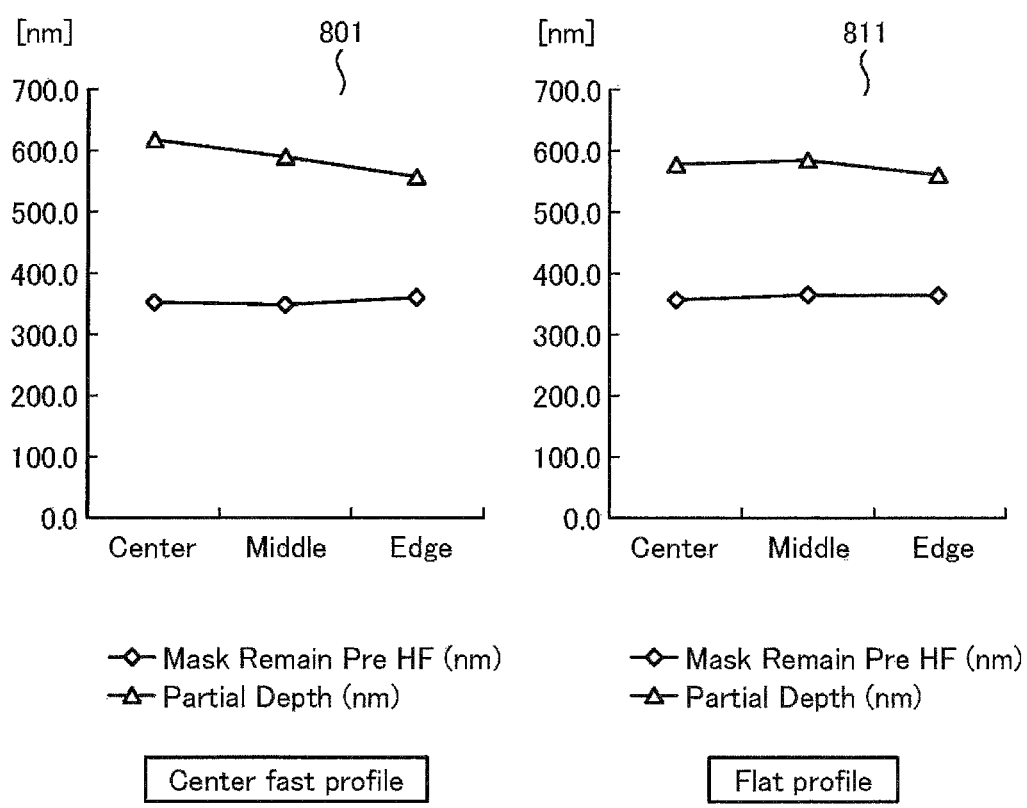
FIG. 7B illustrates graphs of processing results according to Comparative Example 3 and Example 6.

FIGS. 7A and 7B are a diagram and graphs illustrating the processing results according to Comparative Example 3 and Example 6, respectively. A trace diagram 701 of FIG. 7A is a trace diagram of a photograph which is obtained by enlarging a cross section of the central portion of the object to be processed after the plasma processing process in Comparative Example 3. A trace diagram 702 is a trace diagram of a photograph which is obtained by enlarging a cross section of an intermediate portion positioned between the central portion and the peripheral portion of the object to be processed after the plasma processing process in Comparative Example 3. A trace diagram 703 is a trace diagram of a photograph which is obtained by enlarging a cross section of the peripheral portion of the object to be processed after the plasma processing process in Comparative Example 3. A trace diagram 711 is a trace diagram of a photograph which is obtained by enlarging a cross section of the central portion of the object to be processed after the plasma processing process in Example 6. A trace diagram 712 is a trace diagram of a photograph which is obtained by enlarging a cross section of an intermediate portion positioned between the central portion and the peripheral portion of the object to be processed after the plasma processing process in Example 6. A trace diagram 713 is a trace diagram of a photograph which is obtained by enlarging a cross section of the peripheral portion of the object to be processed after the plasma processing process in Example 6.

Further, Graph 801 of FIG. 7B illustrates a shape of each portion of the object to be processed in Comparative Example 3. Graph 811 illustrates a shape of each portion of the object to be processed in Example 6.

Further, in FIGS. 7A and 7B, "Center", "Middle", and "Edge" represent a central portion, an intermediate portion, and a peripheral portion of the object to be processed, respectively. Further, in FIG. 7B, "Mask Remain" represents a height of the mask and "Partial Depth" represents an etching depth of the film to be processed.

As illustrated in FIGS. 7A and 7B, in Comparative Example 3 in which the biasing power was not pulse-modulated, the height of the mask becomes lower toward the central portion from the peripheral portion of the object to be processed and the etching depth of the film to be processed becomes deeper toward the central portion from the peripheral portion of the object to be processed. On the other hand, in Example 6 in which the biasing power was pulse-modulated so that the duty ratio became 60% and the frequency became 10 kHz, the height of the mask and the etching depth of the film to be processed are almost constant toward the central portion from the peripheral portion of the object to be processed.

As described above, as may be appreciated from the comparison of Comparative Example 3 with Example 6, in Example 6, unlike in the method which does not pulse-modulate the biasing power, it is possible to improve the uniformity of the surface of the object to be processed by etching the object to be processed by the plasma of the processing gas while pulse-modulating the biasing power.
(Verification Result (2) of Influence of Duty Ratio and Frequency on Center Fast Profile)

Figure 8A:
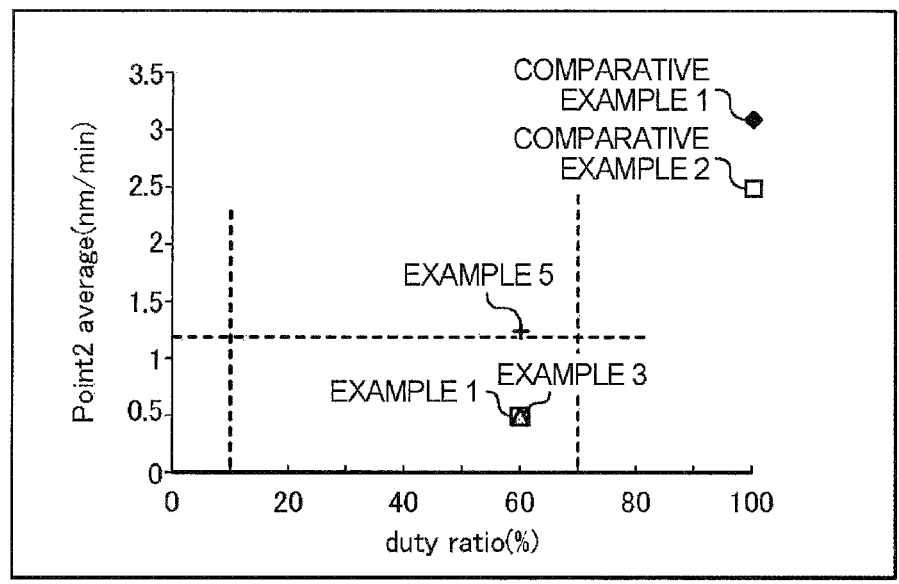
FIG. 8A is a graph illustrating a verification result (2) of an influence of a duty ratio and a frequency on a center fast profile.
Figure 8B:
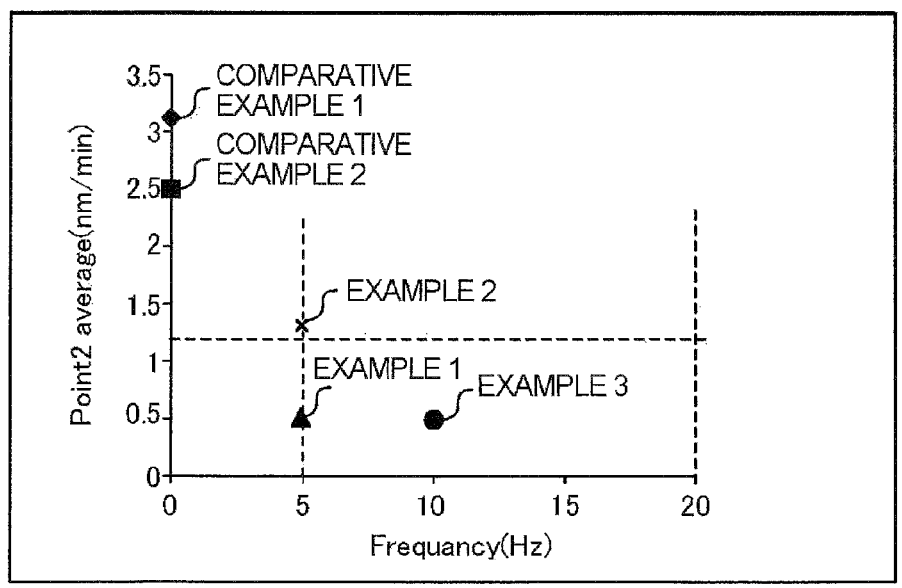
FIG. 8B is a graph illustrating a verification result (2) of an influence of a duty ratio and a frequency on a center fast profile.

FIGS. 8A and 8B are graphs illustrating a verification result (2) of an influence of a duty ratio and a frequency on a center fast profile. In FIGS. 8A and 8b, the vertical axis represents a Point2 average (nm/min). In FIG. 8A, the horizontal axis represents the duty ratio percentage of the biasing power after the pulse modulation. In FIG. 8B, the horizontal axis represents the frequency (kHz) of the biasing power after the pulse modulation. FIG. 8A illustrates all the measurement points corresponding to Comparative Examples 1 and 2, and Examples 1, 3 and 5, respectively. FIG. 8B illustrates all the measurement points corresponding to Comparative Examples 1 and 2, and Examples 1 to 3, respectively. In FIGS. 8A and 8B, the "Point2 average" represents the difference between the etching rate of the central position of the object to be processed and the etching rate of a position shifted radially by ±30 mm from the central position of the objected to be processed.

As illustrated in FIGS. 8A and 8B, in each of Examples in which the biasing power was pulse-modulated, the "Point 2 average" was reduced as compared to Comparative Examples 1 and 2 in which the biasing power was not pulse-modulated. That is, it was found that in each of Example, the level of the center fast profile was reduced compared with Comparative Examples 1 and 2. For this reason, the present inventors measured the "Point2 average" on a plural of measurement points which are present around measurement points corresponding to Examples, respectively. As a result of the measurement, when the biasing power was pulse-modulated so that the duty ratio ranged from 10% to 70% and the frequency ranged from 5 kHz to 20 kHz, the "Point2 average" satisfied predefined allowable specifications (e.g., 1.2 or less). In a case where the biasing power was pulse-modulated so that that the duty ratio ranged from about 40% to about 60% and the frequency ranged from about 5 kHz to about 10 kHz, the "Point2 average" was reduced as compared to a case where the biasing power was pulse-modulated so that the duty ratio ranged from about 10% to about 70% and the frequency ranged from about 5 kHz to about 20 kHz. That is, it was confirmed that the level of the center fast profile was reduced by pulse-modulating the biasing power so that the duty ratio ranged from about 10% to about 70% and the frequency ranged from about 5 kHz to about 20 kHz, preferably the duty ratio ranged from about 40% to about 60% and the frequency ranged from about 5 kHz to about 10 kHz.

Example 7

In Example 7, as a plasma generating power, a biasing power, a duty ratio of a biasing power after pulse modulation, and a frequency of a biasing power after pulse modulation, the following conditions were used. Other aspects are the same as Example 1.

High frequency power (plasma generating power) from first high frequency power supply: 400 W High frequency power (biasing power) from second high frequency power supply: 1850 W Duty ratio of biasing power after pulse modulation: 30%

Frequency of biasing power after pulse modulation: 10 kHz

Example 8 to Example 10

In Example 8 to Example 10, as processing gases, the following processing gases were used, respectively. Other aspects are the same as Example 7.

Example 8: $HBr/NF_3/O_2/Ar=300/34/24/50$ sccm
Example 9: $HBr/NF_3/O_2/Ar=300/34/24/100$ sccm
Example 10: $HBr/NF_3/O_2/Ar=300/34/24/200$ sccm Processing Results According to Example 7 to Example 10

Figure 9A:
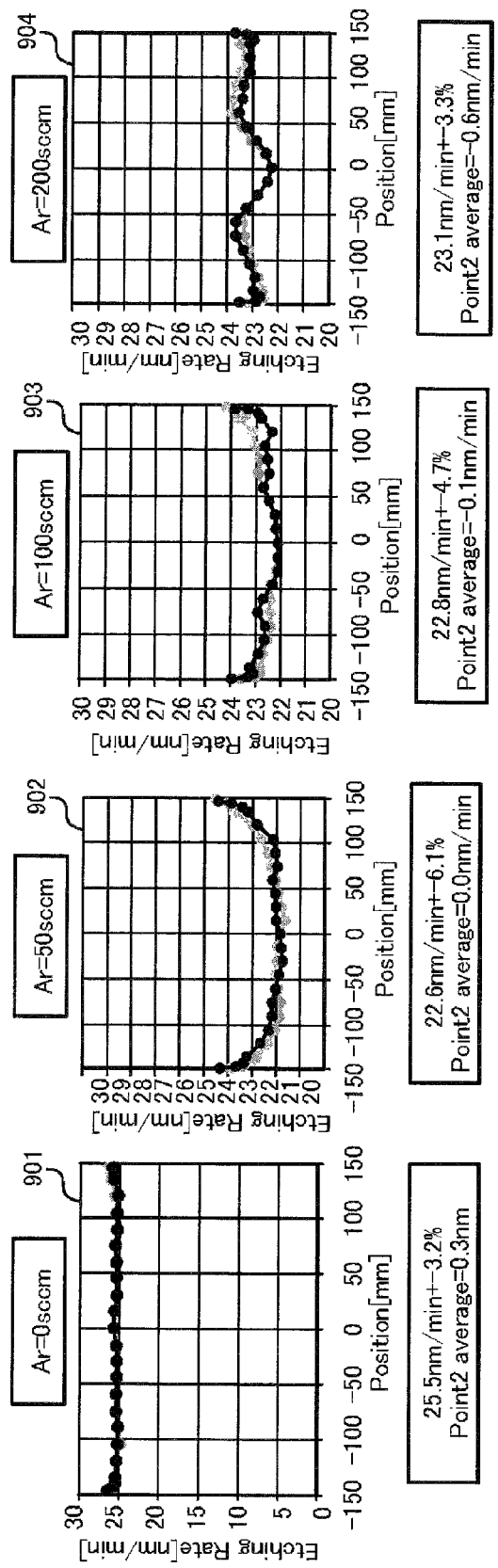
FIG. 9A illustrates graphs of processing results according to Examples 7 to 10.
Figure 9B:
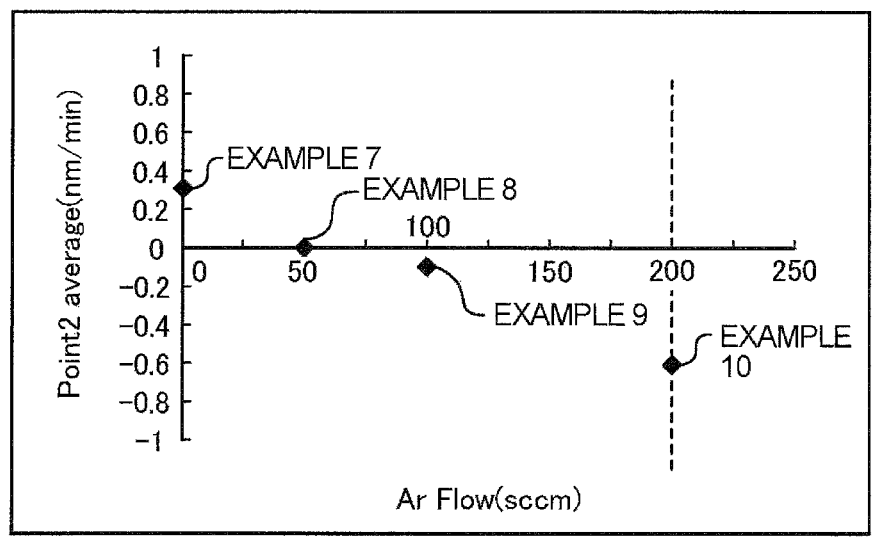
FIG. 9B illustrates a graph of processing results according to Examples 7 to 10.

FIGS. 9A and 9B illustrate graphs of processing results according to Examples 7 to 10. Graphs 901 to 904 of FIG. 9A illustrate the etching rates of the objects to be processed in Examples 7 to 10, respectively. In Graphs 901 to 904, the vertical axis represents the etching rate (nm/min) when the $SiO_2$ film of the object to be processed was etched by the plasma of $HBr/NF_3/O_2$ or the plasma of $HBr/NF_3/O_2/Ar$. Further, in Graphs 901 to 904, the horizontal axis represents the position in a radial direction of the object to be processed. That is, Graphs 901 to 904 illustrate the etching rates from a peripheral position "−150 (mm)" from a central position of the object to be processed to a peripheral position "+150 (mm)" when the central position of the object to be processed is set to be "0".

In FIG. 9B, the vertical axis represents a Point2 average (nm/min), and the horizontal axis represents a flow rate (sccm) of Ar.

In FIGS. 9A and 9B, the "Point2 average" represents the difference between the etching rate of the central position of the object to be processed and the etching rate of a position shifted radially by ±30 mm to the peripheral side from the central position of the object to be processed. The "Point2 average" of a predetermined value (for example 1.2) or more represents that a center fast profile in which the etching rate of the central portion of the object to be processed is excessively higher than that of the peripheral portion of the object to be processed occurs.

As illustrated in FIGS. 9A and 9B, in Example 7 in which Ar was not used, the average of the etching rates at plural positions in the radial direction of the object to be processed was 25.5 nm/min and the variation in the average etching rate was ±3.2%. Both the average etching rate and the variation satisfied the predefined allowable specifications. Further, in Example 7, the "Point2 average" was 0.3 nm/min. The "Point2 average" was a value which represents that the level of the center fast profile was more reduced compared with Comparative Example 1. That is, compared with Comparative Example 1, in Example 7, the difference between the etching rate of the peripheral portion of the object to be processed and the etching rate of the central portion of the object to be processed was smaller.

In each of Examples 8 to 10 in which Ar was used, an average of the etching rates at plural positions in the radial direction of the object to be processed was 22.6 nm/min, 22.8 nm/min and 23.1 nm/min. Further, in each of Examples 8 to 10, a variation in the average etching rate was ±6.1%, ±4.7% and ±3.3%. Both the average etching rates and the variations satisfied the predefined allowable specifications. Further, in each of Examples 8 to 10, the "Point2 average" was 0.0 nm/min, −0.1 nm/min and −0.6 nm/min. The "Point2 averages" were values which represent that the level of the center fast profile was more reduced compared with Comparative Example 1. That is, compared with Comparative Example 1, in each of Examples 8 to 10, the difference between the etching rate of the peripheral portion of the object to be processed and the etching rate of the central portion of the object to be processed was smaller.

In each of Examples 8 to 10 in which Ar was used, the "Point2 average" was decreased as the flow rate of Ar was increased. From this result, it was found that it is possible to control the etching rate and the CD at the central portion of the object to be processed to required values by varying the flow rate of Ar. The reason the "Point2 average" is decreased according to an increase of a flow rate of Ar may be as follows. That is, it is assumed that among ions in plasma, negative ions (e.g., $Br^-$) prone to be concentrated at the central portion of the object to be processed are offset by Ar ions as positive ions, and as a result, the etching of the central portion of the object to be processed, is suppressed from being progressed.

Examples 11 to 14

In each of Examples 11 to 14, as the biasing power, the following condition was used. Other aspects are the same as Example 7.

Example 11: 640 W
Example 12: 1350 W
Example 13: 2350 W
Example 14: 2850 W (Processing Results According to Examples 11 to 14)

FIGS. 10A and 10B illustrate graphs of the processing results according to Examples 11 to 14. GRAPHS 1001 and 1002 of FIG. 10A illustrate etching rates of the objects to be processed in Examples 12 and 13, respectively. In GRAPHS 1001 and 1002, the vertical axis represents an etching rate (nm/min) when the $SiO_2$ film of the object to be processed was etched by the plasma of HBr/NF$_3$/O$_2$ or the plasma of HBr/NF$_3$/O$_2$/Ar. Further, in GRAPHS 1001 and 1002, the horizontal axis represents a position in a radial direction of the object to be processed. That is, GRAPHS 1001 and 1002 illustrate the etching rates from a peripheral position "–150 (mm)" from a central position of the object to be processed to a peripheral position "+150 (mm)" when the central position of the object to be processed is set to be "0".

In FIG. 10B, the vertical axis represents a Point2 average (nm/min), and the horizontal axis represents a biasing power (W).

In FIGS. 10A and 10B, the "Point2 average" represents a difference between the etching rate of the central position of the object to be processed and the etching rate of a position shifted radially by ±30 mm to the peripheral side from the central position of the object to be processed. The "Point2 average" of a predetermined value (for example 1.2) or more represents that a center fast profile in which the etching rate of the central portion of the object to be processed is excessively higher than that of the peripheral portion of the object to be processed occurs.

As illustrated in FIGS. 10A and 10B, in each of Examples 12 and 13 in which a biasing power was 1350 W, and 2350 W, an average of the etching rates at plural positions in the radial direction of the object to be processed was 21.0 nm/min and 29.4 nm/min. In each of Examples 12 and 13, a variation in the average etching rate was ±4.9% and ±4.1%. Both the average etching rates and the variations satisfied the predefined allowable specifications. Further, in each of Examples 11 to 14, the "Point2 average" was 0.5 nm/min, 0.1 nm/min, 0.5 nm/min and 1.1 nm/min. The "Point2 averages" were values which represent that the level of the center fast profile was more reduced compared with Comparative Example 1. That is, compared with Comparative Example 1, in each of Examples 11 to 14, the difference between the etching rate of the peripheral portion of the object to be processed and the etching rate of the central portion of the object to be processed was smaller.

As illustrated in FIG. 10B, in each of Examples 12 to 14, the "Point2 average" was increased as the biasing power was increased. From this result, it was found that it is possible to control the etching rate and the CD at the central portion of the object to be processed to required values by varying the biasing power.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing method using a plasma processing apparatus including a lower electrode serving as a mounting unit of an object to be processed, and an upper electrode disposed to face the lower electrode, the plasma processing method comprising:
    supplying a processing gas into a processing container in which the object to be processed is disposed;
    supplying a plasma generating power of a frequency ranging from about 100 MHz to about 150 MHz to the lower electrode as a power for generating plasma of the processing gas supplied into the processing container, and supplying a biasing power which is a power having a frequency lower than the frequency of the plasma generating power to the lower electrode; and
    etching the object to be processed by the plasma of the processing gas while pulse-modulating the biasing power so that a duty ratio ranges from about 10% to about 70% and the frequency ranges from about 5 kHz to about 20 kHz in a state where the plasma generating power is maintained to be turned on in a substantially constant state while the biasing power is modulated with the duty ratio which ranges from about 10% to about 70% in order o uniformize a plasma density at a central portion and at a peripheral portion of the object to be processed.

2. The plasma processing method of claim 1, wherein in the etching of the object to be processed, the object to be processed is etched by the plasma of the processing gas while the biasing power is pulse-modulated so that the duty ratio ranges from about 40% to about 60% and the frequency ranges from about 5 kHz to about 10 kHz.

3. The plasma processing method of claim 1, wherein the object to be processed includes a polysilicon film, and an SiO$_2$ film or an organic film, and
    in the etching of the object to be processed, the polysilicon film is etched by the plasma of the processing gas using the SiO$_2$ film or the organic film as a mask.

4. The plasma processing method of claim 1, wherein the object to be processed includes an SiO$_2$ film, and an organic film or a polysilicon film, and
    in the etching of the object to be processed, the SiO$_2$ film is etched by the plasma of the processing gas using the organic film or the polysilicon film as a mask.

5. The plasma processing method of claim 1, wherein the processing gas includes a CF-based gas.

6. The plasma processing method of claim 1, wherein the biasing power ranges from 500 W to 3,000 W.

7. The plasma processing method of claim 1, wherein a difference between an etching rate of a central position of the object to be processed etched by the etching, and an etching rate of a position shifted radially by a predetermined distance to the peripheral side from the central position of the object to be processed ranges from –1.2 (nm/min) to 1.2 (nm/min).

8. The plasma processing method of claim 1, wherein the object to be processed includes a layered film of a SiO$_2$ film and a polysilicon film, and an organic film, and
    in the etching of the object to be processed, the layered film is etched by the plasma of the processing gas using the organic film as a mask.

9. The plasma processing method of claim 8, wherein the layered film is stacked in at least 24 layers.

10. The plasma processing method of claim 1, wherein the processing gas includes bromine or chlorine, fluorine, and oxygen.

11. The plasma processing method of claim 10, wherein the processing gas further includes argon.

12. The plasma processing method of claim 1, wherein, in the supplying the plasma generating power, the frequency of the biasing power ranges from about 0.4 kHz to about 13.56 MHz.

13. The plasma processing method of claim 12, wherein the frequency of the biasing power during an initial supplying of the plasma generating power ranges from about 0.4 MHz to about 13.56 MHz, and thereafter the frequency of the biasing power ranges from about 5 kHz to about 20 kHz during etching.

14. The plasma processing method of claim 12, wherein the frequency of the biasing power during the initial supplying of the plasma generating power is about 13.56 MHz.

* * * * *